United States Patent
Davies et al.

(10) Patent No.: US 10,811,383 B2
(45) Date of Patent: Oct. 20, 2020

(54) APPARATUS AND METHOD FOR MANUFACTURING PLURALITY OF ELECTRONIC CIRCUITS

(71) Applicant: PRAGMATIC PRINTING LTD., Sedgefield Durham (GB)

(72) Inventors: Neil Davies, Herts (GB); Richard David Price, Manchester (GB); Stephen Devenport, Gateshead (GB); Stuart Philip Speakman, Essex (GB)

(73) Assignee: PRAGMATIC PRINTING LTD., Sedgefield Durham (GB)

( * ) Notice: Subject to any disclaimer, the term of this patent is extended or adjusted under 35 U.S.C. 154(b) by 85 days.

(21) Appl. No.: 16/075,829

(22) PCT Filed: Feb. 9, 2017

(86) PCT No.: PCT/GB2017/050330
§ 371 (c)(1),
(2) Date: Jan. 18, 2019

(87) PCT Pub. No.: WO2017/141013
PCT Pub. Date: Aug. 24, 2017

(65) Prior Publication Data
US 2019/0067243 A1    Feb. 28, 2019

(30) Foreign Application Priority Data
Feb. 15, 2016    (GB) .................................. 1602635.3

(51) Int. Cl.
*H01L 23/00*    (2006.01)

(52) U.S. Cl.
CPC .............. *H01L 24/97* (2013.01); *H01L 24/75* (2013.01); *H01L 24/81* (2013.01);
(Continued)

(58) Field of Classification Search
CPC ......... H01L 24/97; H01L 24/81; H01L 24/75; H01L 2224/75601; H01L 2224/1329;
(Continued)

(56) References Cited

U.S. PATENT DOCUMENTS

| | | | |
|---|---|---|---|
| 7,500,307 B2 * | 3/2009 | Munn | G06K 19/07718 29/592.1 |
| 2004/0154161 A1 | 8/2004 | Aoyama et al. | |

(Continued)

FOREIGN PATENT DOCUMENTS

| | | |
|---|---|---|
| EP | 1043925 A2 | 10/2000 |
| EP | 1746636 A1 | 1/2007 |
| JP | 2005-149130 A | 6/2005 |
| JP | 2005-215754 A | 8/2005 |
| WO | WO 03/058708 | 7/2003 |

OTHER PUBLICATIONS

International Preliminary Report on Patentability for International Application No. PCT/GB2017/050330, dated Aug. 30, 2018.
(Continued)

*Primary Examiner* — Kyoung Lee
(74) *Attorney, Agent, or Firm* — Jason H. Vick; Sheridan Ross, PC (57) ABSTRACT

A method of manufacturing a plurality of electronic circuits is disclosed. Each electronic circuit comprises a respective first portion, comprising a respective group of contact pads, and a respective integrated circuit, IC, comprising a respective group of terminals and mounted on the respective group of contact pads with each terminal in electrical contact with a respective contact pad. The method comprises: providing a first structure comprising the plurality of first portions; providing a second structure comprising the plurality of ICs and a common support arranged to support the plurality of ICs; transferring said ICs from the common support onto a first roller; transferring said ICs from the first roller onto a second roller; and transferring said ICs from the second
(Continued)

roller onto the first structure such that each group of terminals is mounted on a respective group of contact pads.

18 Claims, 4 Drawing Sheets

(52) U.S. Cl.
CPC ............... *H01L 2224/133* (2013.01); *H01L 2224/1329* (2013.01); *H01L 2224/7565* (2013.01); *H01L 2224/7598* (2013.01); *H01L 2224/75601* (2013.01); *H01L 2224/75611* (2013.01); *H01L 2224/75651* (2013.01); *H01L 2224/81192* (2013.01); *H01L 2224/95115* (2013.01); *H01L 2224/97* (2013.01)

(58) Field of Classification Search
CPC ........... H01L 2224/97; H01L 2224/133; H01L 2224/7565; H01L 2224/7598; H01L 2224/95115; H01L 2224/81192; H01L 2224/75651; H01L 2224/75611; H01L 24/91; H01L 21/67121; H05K 13/04
See application file for complete search history.

(56) References Cited

U.S. PATENT DOCUMENTS

| | | | |
|---|---|---|---|
| 2007/0020801 A1* | 1/2007 | Ishikawa | G06K 19/07718 438/106 |
| 2007/0183184 A1 | 8/2007 | Nakamura et al. | |
| 2009/0297300 A1 | 12/2009 | Brod | |
| 2012/0118506 A1 | 5/2012 | Kim et al. | |

OTHER PUBLICATIONS

International Search Report for International Application No. PCT/GB2017/050330, dated May 26, 2017.
Written Opinion for International Application No. PCT/GB2017/050330, dated May 26, 2017.
Search Report for corresponding Great Britain Application No. 1602635.3, dated Aug. 15, 2016.
Examination Report for corresponding Great Britain Application No. 1602635.3, dated Apr. 27, 2020.

* cited by examiner

APPARATUS AND METHOD FOR MANUFACTURING PLURALITY OF ELECTRONIC CIRCUITS

CROSS REFERENCE TO RELATED APPLICATIONS

This application is a national stage application under 35 U.S.C. 371 of PCT Application No. PCT/GB2017/050330, having an international filing date of 9 Feb. 2017, which designated the United States, which PCT application claimed the benefit of Great Britain Application No. 1602635.3, filed 15 Feb. 2016, each of which are incorporated herein by reference in their entirety.

FIELD OF THE INVENTION

The present invention relates to methods and apparatus for manufacturing a plurality of electronic circuits, and in particular, although not exclusively, for methods and apparatus suitable for mass production of high volumes of flexible electronic circuits.

BACKGROUND

A wide variety of techniques are known for manufacturing integrated circuits for incorporation in larger, overall electronic circuits, typically mounted on contact pads. Often, the techniques for manufacturing those integrated circuits (or ICs) result in the formation of an array of densely packed ICs on a common support (e.g. wafer), and then those ICs need to be separated or handled in some way from that common support (which typically provided support during the IC production process) to their final or target destination on the larger electronic circuit. The handling and transport of the ICs from the initial common support to their installation positions poses a number of problems, which are well known in the art. Particularly, in the case of thin and/or flexible ICs the provision of suitable handling is particularly challenging. For example, thin and/or flexible ICs are particularly delicate and may be damaged by inappropriate handling, leading to failure of the eventual electronic circuits in which they are incorporated.

One potential technique for transferring integrated circuits from a common support to a destination position is a planar transfer process in which a platen may be used to pick up the devices (ICs) from a common support (for example in the form of a wafer) by engaging the wafer in a plane. The ICs may be picked up and placed in their target destinations/positions individually, or a number may be picked up in parallel. Picking and placing ICs in this manner has a number of disadvantages. Firstly, if ICs are picked and placed individually, then this is a time consuming and laborious process when a large number of circuits need to be manufactured (i.e. when a large number of ICs need to be handled). It requires very accurate control and placement of the picking mechanism, both relative to the wafer carrying the ICs and the target positions on the eventual electronic circuit or circuits. Furthermore, if the ICs are particularly small, it may pose difficulties to produce a moveable platen having appropriately small dimensions so as to be able to pick and place an individual IC. Although it may be possible to use a larger platen for picking up a number of ICs in parallel, this may pose difficulties both in terms of achieving a sufficiently flat platen, and/or achieving uniform contact pressure over the plurality of ICs such that they may be picked and placed without damage or failure.

Thus, picking and placing of ICs from a wafer, or other common support, poses a number of technical challenges and problems, especially when high volumes and/or fast transfer of large numbers of ICs is required.

BRIEF SUMMARY OF THE DISCLOSURE

Accordingly, it is an object of certain embodiments of the invention to provide methods and apparatus for manufacturing a plurality of electronic circuits which overcome, at least partly, one or more of the problems associated with the prior art.

According to a first aspect of the invention there is provided a method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:
providing (e.g. manufacturing) a first structure comprising the plurality of first portions;
providing (e.g. manufacturing) a second structure comprising the plurality of ICs and a common support arranged to support the plurality of ICs;
transferring said ICs from the common support onto a first roller;
transferring said ICs from the first roller onto a second roller; and
transferring said ICs from the second roller onto the first structure such that each group of terminals is mounted on (brought into electrical contact with) a respective group of contact pads.

In certain embodiments said first structure has a first surface (side) and the groups of contact pads are arranged at the first surface (side).

In certain embodiments said a common support is arranged to support the plurality of ICs such that each group of terminals faces away from the common support.

In certain embodiments each IC has a nominal upper side, at which the respective group of terminals is provided, and a nominal lower side, the ICs being supported on the common support such that each lower side faces the support and each group of terminals faces away from the common support.

In certain embodiments each IC is substantially planar (generally flat) with the respective group of terminals being provided at one face (surface) of the IC.

In certain embodiments transferring said ICs from the common support onto the first roller is arranged such that when each IC is on (supported on) the first roller the respective group of terminals faces towards the first roller (e.g. faces towards a surface of the first roller, or, equivalently, faces radially inwards, towards a rotational axis of the first roller).

In certain embodiments transferring said ICs from the first roller onto the second roller is arranged such that when each IC is on (supported on) the second roller the respective group of terminals faces away from the second roller (e.g. away from a surface of the second roller, i.e. faces radially outwards, away from a rotational axis of the second roller).

In certain embodiments transferring said ICs from the common support onto the first roller comprises picking (e.g. pulling, extracting, peeling, lifting, separating) said ICs from the common support with the first roller.

In certain embodiments said picking comprises engaging each IC (e.g. engaging an upper, or exposed side, face, or surface of each IC, at which the respective group of terminals is provided) with a respective one of a plurality of IC-engaging features (structures, members, elements, protrusions, bodies) provided on the first roller.

In certain embodiments each IC-engaging feature is a feature extending radially outwards from (raised above, protruding from) a nominal base surface (e.g. substantially cylindrical surface) of the first roller.

In certain embodiments each IC-engaging feature comprises a respective IC-engaging surface, each IC-engaging surface being arranged a common radial distance from a rotational axis of the first roller.

In certain embodiments optionally the method may further comprise providing adhesive on each IC-engaging surface and/or a surface (of each IC) to be engaged by the respective IC-engaging surface.

In certain embodiments each IC-engaging surface is resilient.

In certain embodiments each IC-engaging feature is resilient.

In certain embodiments the plurality of ICs are arranged as a regular array on the common support, with a repetition interval of a distance D1 in a first direction, and the plurality of IC-engaging features are arranged as a regular array on the first roller with a repetition interval (distance, period) of n×D1 in a corresponding first direction, where n is an integer greater than or equal to 2, and the method comprises arranging the second structure at a first position relative to the first roller, picking a first group of the plurality of ICs from the common support by selectively engaging each IC (e.g. the upper side and/or the group of terminals of each IC) of that first group with said IC-engaging features, transferring said first group of ICs from the first roller onto the second roller and then from the second roller onto the first structure.

In certain embodiments said corresponding first direction is one of: a direction parallel to a rotational axis of the first roller; and a circumferential distance around the first roller (i.e. at a constant radius from the rotational axis of the first roller, in a plane perpendicular to the rotational axis).

In certain embodiments the first portions are arranged as a regular array in the first structure and n×D1 corresponds to a repetition interval of the groups of contact pads in a corresponding first direction on the first structure (i.e. it corresponds to an inter-group repetition interval, not, of course, a repetition interval of contact pads within a particular group).

In certain embodiments, after transferring said first group of ICs from the first roller onto the second roller and then from the second roller onto the first structure, arranging the remaining portion of the second structure at a second position relative to the first roller, picking a second group of the plurality of ICs from the common support by selectively engaging each IC (e.g. the upper side of each IC) of that second group with said IC-engaging features, transferring said second group of ICs from the first roller to the second roller and then from the second roller onto the first structure.

In certain embodiments the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

In certain embodiments said corresponding second direction is one of: a circumferential distance around the first roller (i.e. at a constant radius from the rotational axis of the first roller, in a plane perpendicular to the rotational axis); and a direction parallel to the rotation axis of the first roller.

In certain embodiments the first portions are arranged as a regular array in the first structure and m×D2 corresponds to a repetition interval of the groups of contact pads in a corresponding second direction on the first structure (i.e. it corresponds to an inter-group repetition interval, not, of course, a repetition interval of contact pads within a particular group).

In certain embodiments the common support is substantially flat.

In certain embodiments the common support is rigid.

In certain embodiments the common support is flexible.

In certain embodiments transferring said ICs from the common support onto the first roller comprises: rotating the first roller about a rotational axis of the first roller; and performing a relative translation between the common support and the rotation axis of first roller (e.g. in a direction perpendicular or transverse to the rotational axis of the first roller).

In certain embodiments transferring said ICs from the first roller onto the second roller comprises: rotating the first roller about a rotational axis of the first roller; and rotating the second roller about a rotational axis of the second roller, the rotational axis of the first roller being parallel to the rotation axis of the second roller.

In certain embodiments said rotating of the first and second rollers comprises rotating the first roller in a first direction and rotating the second roller in an opposite direction.

In certain embodiments transferring said ICs from the second roller onto the first structure comprises: rotating the second roller about a rotational axis of the second roller; and performing a relative translation between the first structure and the rotation axis of second roller (e.g. in a direction perpendicular or transverse to the rotational axis of the second roller).

In certain embodiments transferring said ICs from first roller onto the second roller comprises picking (e.g. pulling, extracting, peeling, lifting, separating) said ICs from the first roller with the second roller.

In certain embodiments said picking comprises engaging each IC (e.g. engaging a lower or bottom side, face, or surface of each IC, opposite to that at which the respective group of terminals is provided) with a surface of the second roller.

In certain embodiments said surface of the second roller is a cylindrical surface.

In certain embodiments said picking comprises engaging each IC (e.g. engaging a lower or bottom side, face, or surface of each IC, opposite to that at which the respective group of terminals is provided) with a respective one of a plurality of IC-engaging features (structures, members, elements, protrusions, bodies) provided on the second roller.

In certain embodiments each IC-engaging feature on the second roller is a feature extending radially outwards from (raised above, protruding from) a nominal base surface (e.g. substantially cylindrical surface) of the second roller.

In certain embodiments wherein each IC-engaging feature on the second roller comprises a respective IC-engaging surface, each IC-engaging surface being arranged a common radial distance from a rotational axis of the second roller.

Optionally the method may further comprise providing adhesive on the surface of the second roller or on each IC-engaging surface of the second roller, and/or a surface of each IC to be engaged by the second roller.

In certain embodiments each IC-engaging surface of the IC=engaging features on the second roller is resilient.

In certain embodiments each IC-engaging feature on the second roller is resilient.

In certain embodiments said first structure is flexible.

In certain embodiments providing said first structure on a first roll and transferring said first structure from the first roll onto a second roll, wherein said transferring of the ICs from the second roller onto the first structure is performed during said transferring of the first structure from the first roll onto the second roll.

In certain embodiments the method further comprises processing the first structure to separate, after mounting of the respective IC, each electronic circuit from it (e.g. by cutting or otherwise dividing up the first structure).

Apparatus arranged to implement a method in accordance with any preceding claim.

According to an aspect of the present invention there is provided an apparatus for manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the apparatus comprising:

a first roller arranged to rotate about a first rotational axis;

a second roller arranged to rotate about a second rotational axis, said second rotational axis being parallel to the first rotational axis;

roller drive means (roller driving structure, assembly, system, mechanism, or at least one roller driver, for example comprising at least one drive motor) controllable to drive the rollers to rotate about their respective rotational axes);

a first support means (structure, assembly, mechanism) arranged (adapted, configured) to support a first structure comprising the plurality of first portions and controllable to translate said first structure (i.e. when supported by the first support means) relative to said second rotational axis;

a second support means (structure, assembly, mechanism) arranged (adapted, configured) to support a second structure, comprising the plurality of ICs and a common support arranged to support the plurality of ICs, and controllable to translate said second structure (i.e. when supported by the second support means) relative to said first rotational axis; and control means (e.g. a control system, or at least one controller, control unit, or control module) arranged to control the roller drive means and first and second support means to transfer said ICs from the common support onto the first roller, transfer said ICs from the first roller onto the second roller, and transfer said ICs from the second roller onto the first structure such that each group of terminals is mounted on (brought into electrical contact with) a respective group of contact pads.

In certain embodiments the control means is arranged to rotate the first roller to pick said ICs from the common support onto the first roller.

In certain embodiments the first roller comprises a plurality of IC-engaging features (structures, members, elements, protrusions, bodies) each arranged to engage and pick a respective IC from the common support onto the first roller.

In certain embodiments each IC-engaging feature is a feature extending radially outwards from (raised above, protruding from) a nominal base surface (e.g. substantially cylindrical surface) of the first roller.

In certain embodiments each IC-engaging feature comprises a respective IC-engaging surface, each IC-engaging surface being arranged a common radial distance from the rotational axis of the first roller.

In certain embodiments each IC-engaging surface is resilient.

In certain embodiments each IC-engaging feature is resilient.

In certain embodiments the second support means is adapted to support a second structure in which the plurality of ICs are arranged as a regular array on the common support, with a repetition interval of a distance D1 in a first direction, and the plurality of IC-engaging features are arranged as a regular array on the first roller with a repetition interval (distance, period) of n×D1 in a corresponding first direction, where n is an integer greater than or equal to 2, and the control means is adapted to control the roller drive means, second support means, and first support means to position the second structure at a first position relative to the first roller, pick a first group of the plurality of ICs from the common support by selectively engaging each IC (e.g. the upper side and/or the group of terminals of each IC) of that first group with said IC-engaging features, transfer said first group of ICs from the first roller onto the second roller, and transfer said first group from the second roller onto the first structure.

In certain embodiments said corresponding first direction is one of: a direction parallel to a rotational axis of the first roller; and a circumferential distance around the first roller (i.e. at a constant radius from the rotational axis of the first roller, in a plane perpendicular to the rotational axis).

In certain embodiments the first portions are arranged as a regular array in the first structure and n×D1 corresponds to a repetition interval of the groups of contact pads in a corresponding first direction on the first structure (i.e. it corresponds to an inter-group repetition interval, not, of course, a repetition interval of contact pads within a particular group).

In certain embodiments the control means is adapted to control the roller drive means, second support means, and first support means, after transferring said first group of ICs from the first roller onto the second roller and from the second roller onto the first structure, to arrange (position) the remaining portion of the second structure at a second position relative to the first roller, pick a second group of the plurality of ICs from the common support by selectively engaging each IC (e.g. the upper side of each IC) of that second group with said IC-engaging features, transfer said second group of ICs from the first roller to the second roller and transfer said second group of ICs from the second roller onto the first structure.

In certain embodiments the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

In certain embodiments said corresponding second direction is one of: a circumferential distance around the first roller (i.e. at a constant radius from the rotational axis of the first roller, in a plane perpendicular to the rotational axis); and a direction parallel to the rotation axis of the first roller.

In certain embodiments the first portions are arranged as a regular array in the first structure and m×D2 corresponds to a repetition interval of the groups of contact pads in a corresponding second direction on the first structure (i.e. it corresponds to an inter-group repetition interval, not, of course, a repetition interval of contact pads within a particular group).

In certain embodiments the control means is arranged to transfer said ICs from the common support onto the first roller by rotating the first roller about the rotational axis of the first roller, and performing a relative translation between the common support and the rotation axis of first roller (e.g. in a direction perpendicular or transverse to the rotational axis of the first roller).

In certain embodiments the control means is arranged to transfer said ICs from the first roller onto the second roller by rotating the first roller about the rotational axis of the first roller, and rotating the second roller about the rotational axis of the second roller.

In certain embodiments the control means is arranged to transfer said ICs from the first roller onto the second roller by rotating the first roller in a first direction and rotating the second roller in an opposite direction.

In certain embodiments the control means is arranged to transfer said ICs from the second roller onto the first structure by rotating the second roller about the rotational axis of the second roller, and performing a relative translation between the first structure and the rotation axis of second roller (e.g. in a direction perpendicular or transverse to the rotational axis of the second roller).

In certain embodiments the second roller is arranged to pick said ICs from the first roller onto the second roller.

In certain embodiments the second roller comprises a surface arranged to engage each IC to pick each IC from the first roller.

In certain embodiments said surface of the second roller is a cylindrical surface.

In certain embodiments the second roller comprises a plurality of IC-engaging features (structures, members, elements, protrusions, bodies), each arranged to engage and pick a respective IC from the first roller.

In certain embodiments each IC-engaging feature of the second roller is a feature extending radially outwards from (raised above, protruding from) a nominal base surface (e.g. substantially cylindrical surface) of the second roller.

In certain embodiments each IC-engaging feature of the second roller comprises a respective IC-engaging surface, each IC-engaging surface being arranged at a common radial distance from the rotational axis of the second roller.

In certain embodiments each IC-engaging surface of the IC-engaging features of the second roller is resilient.

In certain embodiments each IC-engaging feature of the second roller is resilient.

In certain embodiments said first structure is flexible, and the first support means comprises a first roll for supporting the first structure, and a second roll for supporting the first structure, the control means being adapted to control the first support structure to transfer the first structure from the first roll onto the second roll.

In certain embodiments the control means is further arranged to control the roller drive means and first and second support means to transfer the ICs from the second roller onto the first structure while (during) transferring the first structure from the first roll onto the second roll.

According to an aspect of the present invention there is provided a method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions (e.g. said first structure having a first surface (side) and the groups of contact pads being arranged at the first surface (side));

providing (e.g. manufacturing) a second structure comprising the plurality of ICs and a common support arranged to support the plurality of ICs such that each group of terminals faces away from the common support (e.g. each IC having a nominal upper side, at which the respective group of terminals is provided, and a nominal lower side (which implies that the ICs are generally flat, in contrast to old fashioned chips with legs), the ICs being supported on the common support such that each lower side faces the support and each group of terminals faces away from the support);

transferring said ICs from the common support onto a first roller, such that when each IC is supported on the first roller the respective group of terminals faces towards the first roller (e.g. faces towards a surface of the first roller, or, equivalently, faces radially inwards, towards a rotational axis of the first roller;

transferring said ICs from the first roller onto a second roller, such that when each IC is supported on the second roller the respective group of terminals faces away from the second roller (e.g. away from a surface of the second roller, i.e. faces radially outwards, away from a rotational axis of the second roller); and transferring said ICs from the second roller onto the first structure such that each group of terminals is mounted on (brought into electrical contact with) a respective group of contact pads.

Another aspect provides apparatus arranged to implement such a method.

BRIEF DESCRIPTION OF THE DRAWINGS

Embodiments of the present invention will now be described with reference to the accompanying drawings of which.

DETAILED DESCRIPTION

Figure 1:
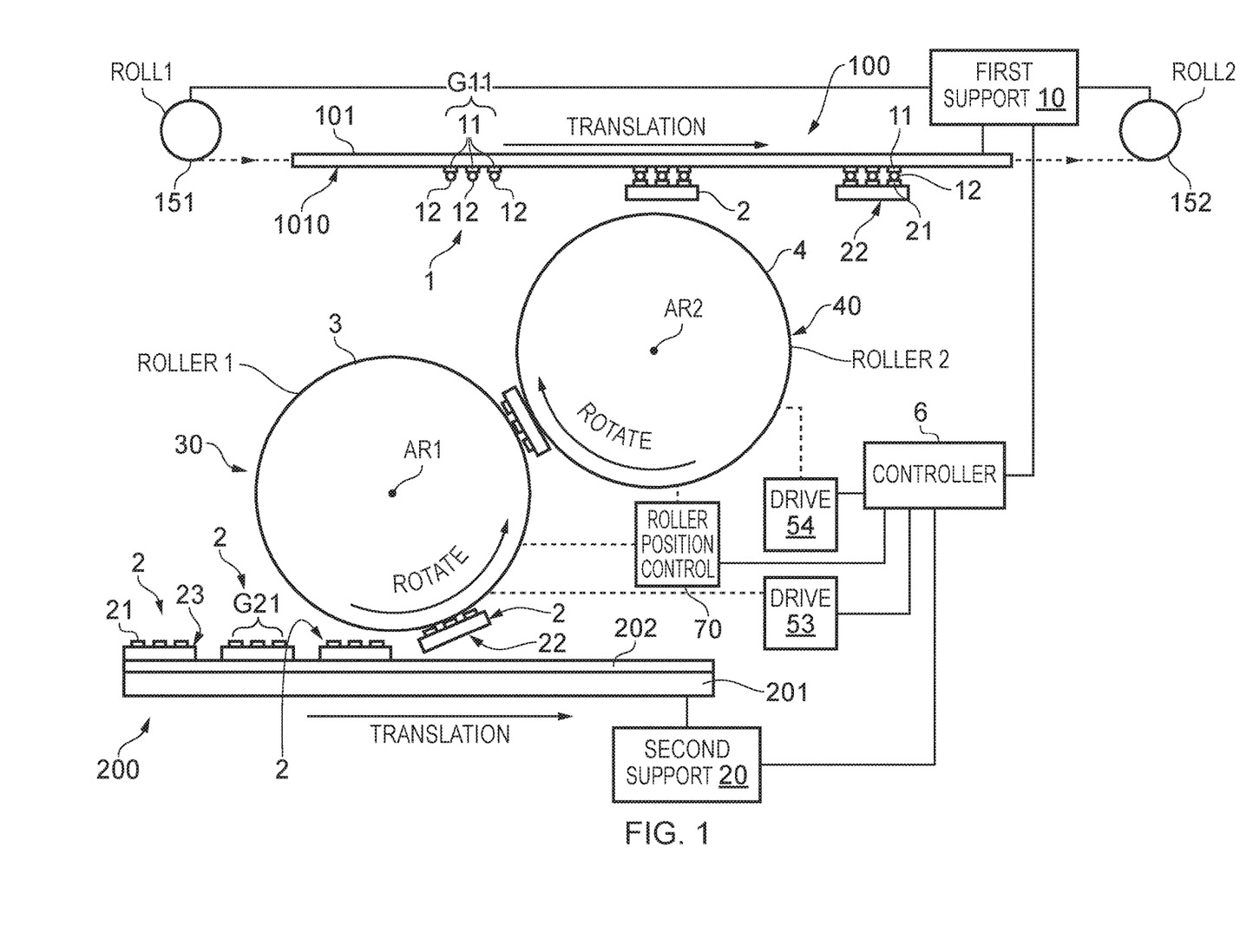
FIG. 1 is a schematic representation of apparatus embodying the invention and suitable for manufacturing a plurality of electronic circuits.

Referring now to FIG. 1 this shows a system, or apparatus, for manufacturing a plurality of electronic circuits, the system or apparatus embodying an aspect of the present invention. Each electronic circuit being manufactured comprises a respective first portion 1, which itself comprises a respective group G11 of contact pads or contacts 11, and a respective integrated circuit 2. Each integrated circuit 2 comprises a respective group G21 of terminals 21. In each electronic circuit, when manufactured, the group of terminals G21 of a particular IC are mounted on a respective group G11 of contact pads with each terminal 21 in electrical contact with respective contact pad 11. In this embodiment, a first structure 100 has been provided (i.e. it has previously been manufactured, for use in the manufacturing system) that first structure 100 comprising the plurality of first portions 1. This first structure 100 comprises a carrier tape 101 having a nominal lower surface 1010 on, or at, which the groups G11 of contact pads are provided for mounting of the ICs 2. In this particular example, the first structure 100 has initially been provided on a first roll 151 and the system is adapted to transfer or convey that first structure 100 from the first roll 151 and onto a second roll 152. The ICs 2 are mounted on, or installed, on the respective groups G11 of contact pads at an intermediate position, i.e. while the structure 100 is being transferred from the first roll 151 onto the second roll 152. The ICs 2 for mounting on the first structure 100 are themselves initially provided on a second structure 200 which comprises a common support 201, in this case a substantially flat, flexible glass or plastic sheet 201. A layer of adhesive 202 temporarily bonds the ICs 2 to the common support 201. In this example, each IC 2 is substantially planar, having a flat lower surface 22 which engages the layer 202 and is thus supported by the common support 201. Each IC also has a nominal upper surface 23 on, or at, which the group G21 of terminals 21 is provided. Thus, the common support 201 supports each IC 2 such that its respective group of terminals 21 faces upwards, away from the common support 201.

The system further comprises a first roller 3 arranged to rotate about a first rotation axis AR1 in a first direction, this first roller having an outer surface 30 which is arranged to engage the tops of the ICs (in particular to engage the groups G21 of terminals 21 and/or the upper surfaces 23 so as to pick each IC up, from the common support 201, and onto the first roller. Thus, the first roller is arranged to lift off or peel each IC2 from the second structure 200. A second roller 4 is arranged to rotate about a second rotation axis AR2 so as to pick each IC2 from the first roller 3 and transfer each IC then onto its mounting position with respect to the first structure 100. The system further comprises roller drive means in the form of a first drive 53 for driving the first roller 3 and a second drive unit 54 for driving the second roller 4. The system also includes a first support, or support means or support system, 10 arranged to support the first structure and also being controllable to translate the first structure relative to the second rotation axis. The system also includes a second support means 20 arranged to support the second structure and being controllable to translate the second structure relative to the first rotation axis. The system also includes a controller or control means 6 arranged to control the first and second support means 10, 20 and the drive means 53, 54. Thus, by suitable control of the first and second support means and the roller drive means the controller is able to transfer the ICs 2 from the second structure 200 onto the first roller, then transfer the ICs 2 from the first roller onto the second roller, and then transfer the ICs from the second roller onto their installation positions on the first structure 100. In this example each IC is itself substantially flexible, and the first structure 100 with ICs mounted upon it is collected on the second roll 152 (the rotation of which, together with rotation of the first roll 151, is under control of the control means 6 in this example). To aid adhesion and mounting, each of the contact pads 11 is provided with conductive adhesive 12. Thus, the carrier tape 101 is provided with contacts 11 and patterned conductive adhesive 12.

It will be appreciated that the first roller 3 picks up the ICs 2 such that, when they are on the first roller, the groups G21 of terminals 21 face the first roller. Then, when the ICs are transferred to the second roller, their groups G21 of terminals 21 face away from the second roller (i.e. away from its rotation axis, so that the ICs have been flipped in order to expose their terminals 21 for mounting on the respective contact pads 11 of the first structure 100.

In this example, the surfaces 30 and 40 of the first and second rollers 3, 4 respectively which engage and temporarily hold each IC during the transfer process are generally smooth. However, it will be appreciated that those contacting surfaces may take different forms in other embodiments, suitable for picking and placing the ICs. Those contacting surfaces 30, 40 may be resilient surfaces, to aid the picking up and transferring processes, and in certain embodiments may be provided with adhesive material and/or adhesive coatings to assist in the picking and transfer of the ICs.

Thus, the system illustrated in FIG. 1 can be operated to implement a roller-transfer process. An advantage of such a system, incorporating roll-release of the ICs from the second structure, is a reduction in the force required to separate the devices (ICs) from the wafer or common support 201 (as compared to alternative techniques in which a vertical pull of each IC from the support is used). Although generally smooth roller surfaces 30, 40 are shown in the figure, alternative embodiments may incorporate rollers with raised features or cells so that only a proportion of the ICs would be picked off as they pass under the first roller. Thus, with such embodiments it is possible to pick out an array of a selected number of ICs from a large array (for example picking out 4 devices from 16, etc).

The system of FIG. 1 also includes roller position control means 70 (apparatus, unit, at least one module etc.), under control of the controller 6 and operable to provide vertical axis and/or horizontal axis control on the two roller positions (in other words, the position controller 70 can be used to set/adjust/vary the vertical and/or horizontal positions of the rollers' axes AR1 and/or AR2) and on the first-surface support, so that the system can be run as described above (both the rollers and surfaces all move at the same time) or the individual transfers (second surface to roller 1, roller 1 to roller 2, and roller 2 to first surface) can be operated independently. This facilitates the process because it makes returning the second surface/wafer back to the start position much easier (it can be disengaged from the roller).

Figure 2:
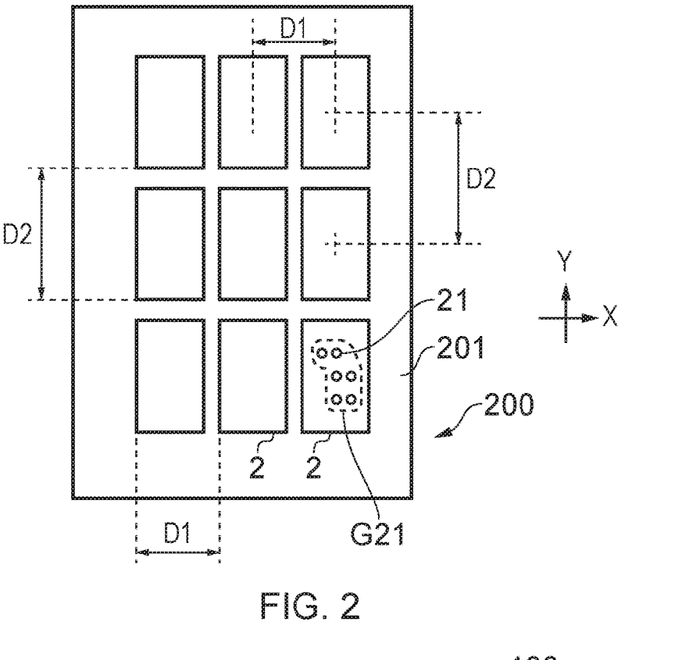
FIG. 2 is a schematic representation of a second structure used in certain embodiments of the invention and comprising an array of ICs supported by a common support.

Referring now to FIG. 2, this shows a second structure for use in embodiments of the invention. Here, the second structure 200 comprises a common support 201 arranged to support a plurality of ICs 2, those ICs being arranged in a regular rectangular array. In this example, each IC has a generally rectangular footprint, and the repetition interval or period of the ICs in a first direction (the nominal X direction) is D1. Thus, D1 corresponds to the separation of the centres of the ICs in the X direction. Similarly, the repetition interval, or centre to centre separation, of the ICs 2 in a second, perpendicular direction (the nominal Y direction) is D2. It will be appreciated that this particular arrangement of ICs is merely one example, and other forms of regular arrays of ICs may be employed in alternative embodiments.

Figure 3:
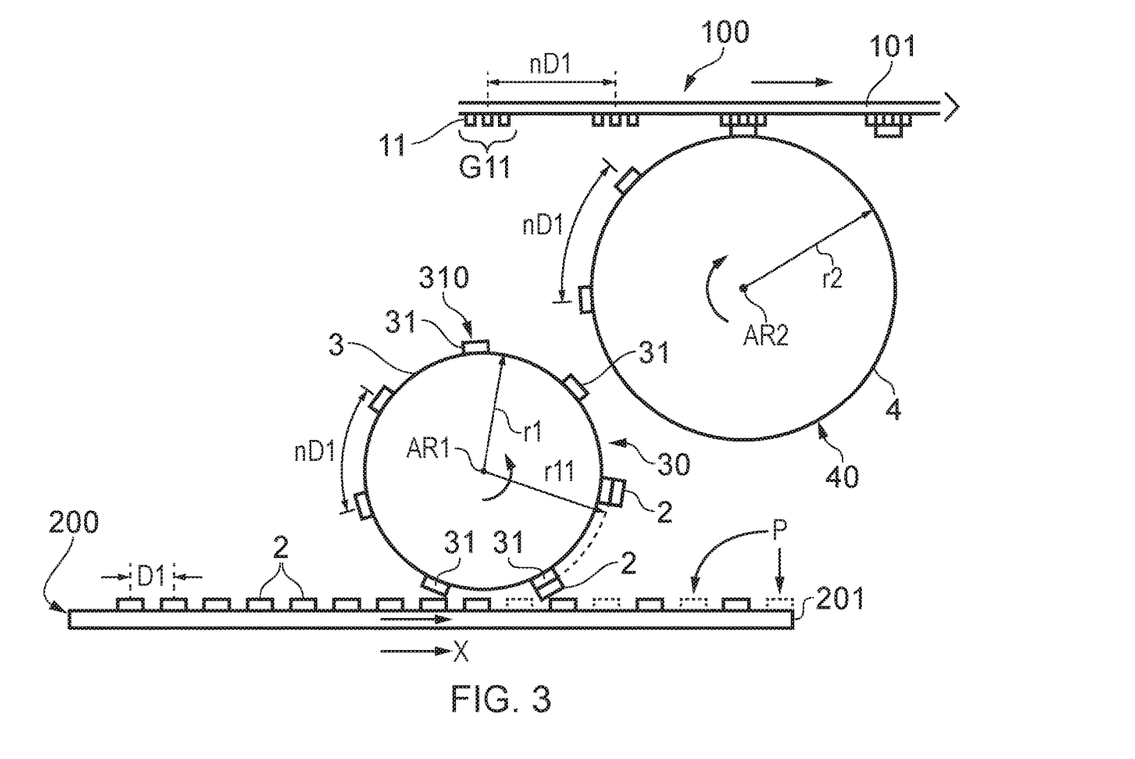
FIG. 3 is a schematic representation of part of another system embodying the invention.

Referring now to FIG. 3, this shows part of another system embodying the invention in which the ICs 2 on the second structure 200 are arranged in a regular array as separated by distance D1 in the nominal X direction. The first roller 3 is provided with a plurality of raised features or cells 31. Each feature 31 has a respective end or IC-engaging surface 310 for picking up one of the ICs 2 from the structure 200. In this example, each end surface 310 is arranged a common radial distance R11 from the rotation axis AR1. Each feature 31 thus extends radially outwards from a nominal base surface 30 of the first roller 3, that base surface being a radial distance R1 from the rotation axis AR1. Rather than these features 31 being arranged to pick up immediately successive ICs from the structure 200, the spacing of the features 31 around the roller perimeter is such that they pick up every other IC 2. Thus, the features 31 have a repetition interval of distance n×D1 in the circumferential direction around the first roller, where n in this example is equal to 2. Thus, the spacing of the IC-engaging features 31 is twice that of the spacing of the ICs in the X direction on the support 200. After the structure 200 has been translated so as to pass beneath the first roller, every other IC 2 has been removed, the previous positions of the removed ICs being indicated by the arrows P in the figure. Thus, by appropriate control of the rotation of the first roller 3 and translation of the structure 200 the system is able to pick a first portion of the ICs 2 from the structure 200 onto the first roller and carry those ICs to the second roller. In this example, the second roller 4 has a substantially cylindrical outer surface 40 on which it picks up the ICs successively from the first roller 3 (in particular, it picks or plucks them from the respective features 31 on which they are conveyed around the first rotation axis). Thus, the spacing n×D1 of the features 31 on the first roller dictates the spacing of the ICs around the circumference of the second roller 4. The first structure 100 has been provided or manufactured such that the inter-group spacing between the respective groups G11 of contact pads 11 is also equal to n×D1 (where n in this example is 2).

Although the integer n was equal to 2 in the above example, it will be appreciated that different values of n may be used in other embodiments, so as to select a particular portion or group of ICs from the second structure 200 for each pass of the structure 200 under the first roller.

In the above-described manner, the system may control the first roller and second support means to locate the structure 200 at a first position relative to the first roller and its cells or features 31. Then, a first pass may be made in which a first group of ICs 2 is picked from the structure 200 and transferred onto the first structure 100. Then, the system may appropriately reposition the second structure 200 and rollers and make a second pass so as to transfer a second group of ICs 2 onto their respective groups of contact pads 11 on the first structure 100.

Figure 4:
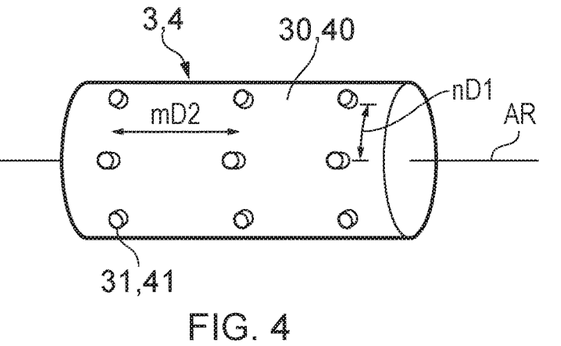
FIGS. 4 and 6 are perspective views of rollers suitable for use in embodiments of the invention.
Figure 5:
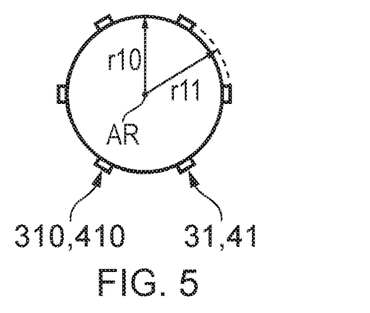
FIGS. 5 and 7 are respective schematic cross sections of the rollers shown in FIGS. 4 and 6.

It will be appreciated that FIG. 3 shows the 2 rollers in cross section and illustrates the spacing of the features 31 in the circumferential direction around the first roller 3. The array of features 31 may also extend in an axial direction along the roller, i.e. in a direction parallel to the rotation axis AR1, as shown in FIG. 4. Thus, the separation of the features 31 in the circumferential direction may be n×D1 so as to be an integer multiple of the separation of the ICs in a corresponding first direction on the second structure 200, and the separation of those features in an axial direction, parallel to the rotation axis, may be m×D2, so as to be an integer multiple of the separation of the ICs in the second direction on the second structure 200.

Although FIG. 3 shows the second roller as having a smooth (i.e. cylindrical) IC engaging surface 40, it will be appreciated that in alternative embodiments the second roller may also be provided with IC engaging features 41, equivalent to those 31 of the first roller 3. Thus, in FIGS. 4-7, each illustrated roller may be used either as a first roller or a second roller in different embodiments. Each IC-engaging feature 310, 410 extends radially outwards from a nominal base surface 30, 40 of the respective cylinder, Each feature has an IC engaging surface 310, 410 which is at a common radial distance R11 from the rotational axis AR.

Figure 6:
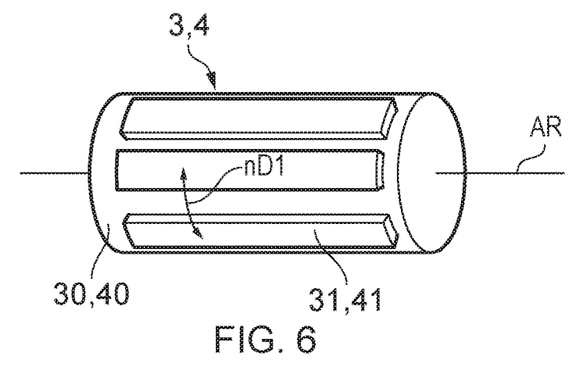
Figure 7:
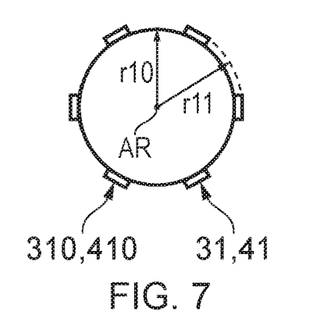

FIG. 6 shows a roller in which the IC-engaging features 31-41 are separated from each other by a distance n×D1 in a circumferential direction around the roller, which each extend in a longitudinal direction along the cylinder. A roller, as shown in FIGS. 6 and 7, may thus be used in certain embodiments as a second roller to engage with and pick ICs from respective rows of IC-engaging features 31 provided on a first roller. Thus, in general, the IC-engaging features, if provided, on the first and second rollers may have the same or different shapes and/or sizes. The features 31 on the first roller may, in certain embodiments be relatively small so as to provide precise, accurate selection of a sub-set of the ICs 2 from the second structure 200, and the features 41 on the second roller may be relatively large to facilitate transfer of the picked ICs from the first roller onto the second roller.

Figure 8:
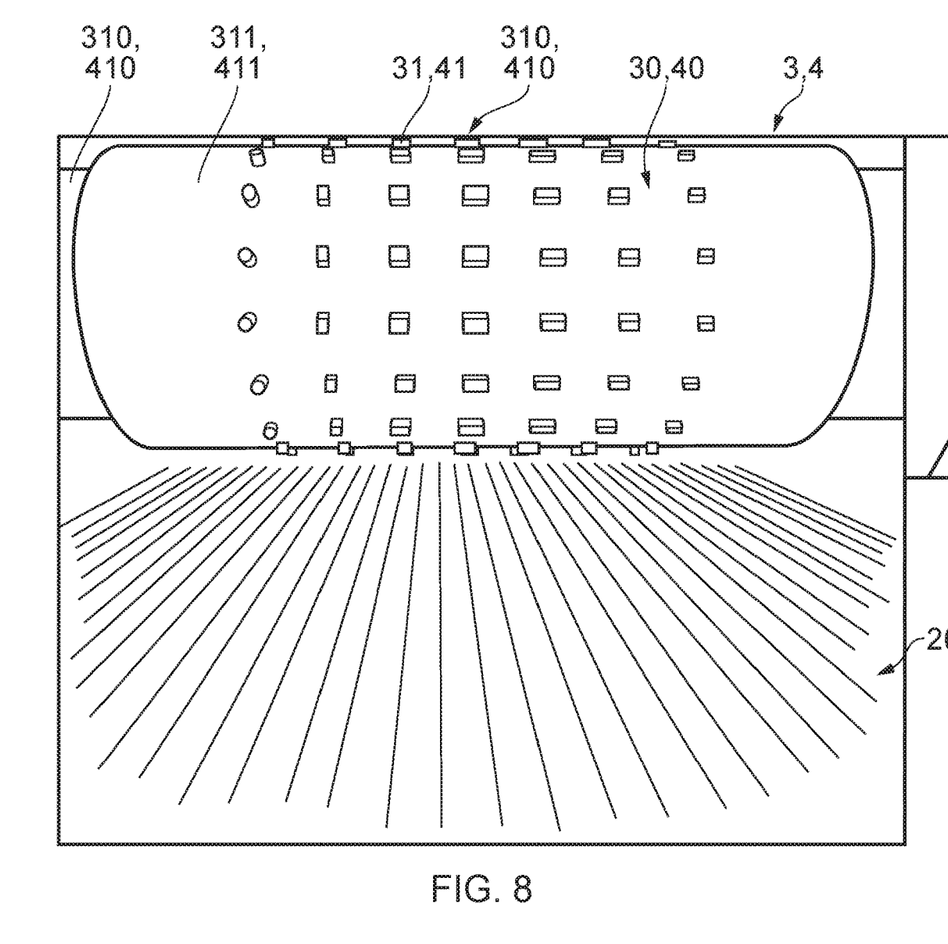
FIGS. 8 and 9 show another roller suitable for use in embodiments of the invention.
Figure 9:
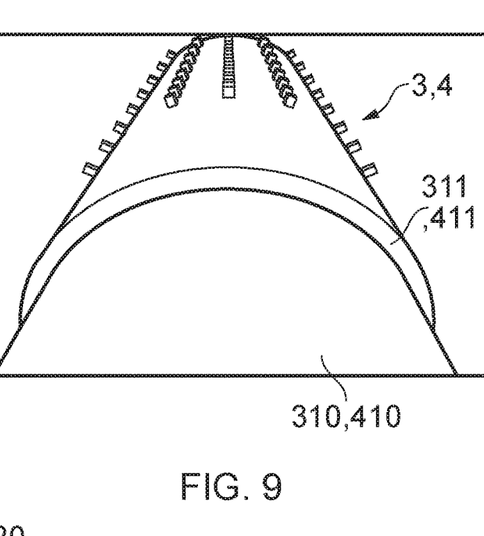

Referring now to FIG. 8 and FIG. 9, these show another roller suitable for use in embodiments of the invention. Here the roller comprises a cylindrical body or centre portion 310, 410 on which an outer resilient and generally cylindrical body of material 311, 411 has been provided. In this example, the resilient body of material is a silicone elastomer sheet. The resilient sheet 311, 411 is provided with an array of resilient features or cells 31, 41, each of which extends from a nominal base surface 30, 40 of the cylindrical member out to a respective IC-engaging surface 310, 410. The array of features 31, 41 in this example includes features of differing sizes and shapes, although the same radial extent from the rotation axis of the cylinder. The roller is shown in FIG. 8 positioned over a base plate which forms part of the second support means 20 for supporting a second structure 200 carrying ICs and translating that structure past the roller such that the features 31, 41 may engage with and pick off a selected group of the ICs.

It will be appreciated that benefits of a transfer process as described above with reference to embodiments of the invention, compared to a pick and place process, include:

a proportion of the densely packed flexible ICs in certain embodiments can be removed from the second structure (e.g. the wafer) and placed into a roller of flexible printed circuits all in one step. An index of the wafer position and an index of the roll can be swiftly carried out ready for the next transfer. This approach lends itself to populating a roll of flexible circuits very rapidly with ICs.

Because multiple devices may be transferred at once, they can remain well aligned to one another and to the first structure (e.g. the circuit roll). In comparison, with a pick and place scenario every IC has to be picked up individually and aligned precisely to the circuit it is being placed into. This requires expensive, precise, and fast alignment systems (including high grade software, cameras, and actuators). Thus, embodiments of the present invention can provide a less expensive, but equally precise, and faster alignment technique, suitable for mass production techniques.

In certain embodiments, flexible ICs are fabricated on thin plastic films, which are temporarily bonded to a rigid (e.g. glass) carrier. In certain embodiments the thickness of the plastic film may be 25 μm, or even 5-10 μm. At these thicknesses, the ICs are very fragile. With a pick and place approach the device must not only be picked up but "flipped" because it is initially picked up from the top (contacts) side, yet has to be placed from the back so that the contacts are down (or at least towards the receiving circuit). A transfer mechanism, such as the dual roll system described above, avoids this additional handling, and also the problem of having to use successive vacuum suckers to get hold of the ICs which may be extremely delicate objects.

Another advantage of embodiments of the invention is that it can make alignment easier. The system can be according to a rigid design, and may be set up to have only one major motion axis. Certain embodiments of the invention resemble a printing process, and are compatible with continuous "sheet to roll" methods of production.

It will be appreciated that details of IC-engaging surfaces, and whether or not to apply suitable adhesives to assist in the picking and placing of ICs may be implemented differently in various embodiments so as to suit particular application details, as would be apparent to the person skilled in this field. In other words, the skilled person will be aware of techniques and details for providing appropriate adhesion between the ICs, rollers, and first and second structures.

It will be appreciated that embodiments of the invention are able to provide well-aligned transfer of ICs onto a first structure using, in certain examples, at least one castellated roller.

It will be appreciated that certain embodiments provide a dual-cylinder IC transfer system able to pick and transfer flexible ICs from an initial second structure to a carrier tape carrying arrays of contact pads. The system may include suitable control means and actuators (e.g. positioning systems or units) to achieve the necessary alignment. The alignment system may incorporate optical means for achieving the desired alignment.

In certain embodiments, the ICs may be plastic film-based ICs, initially provided in a flat array of such devices on a glass carrier plate. Embodiments of the invention are able to transfer such devices onto a carrier tape of corresponding contact pads. This transport utilises first and second rollers, the second roller being present in order to invert the devices so that the IC device contacts are exposed ready to contact the conductive adhesive that may have previously been applied to the carrier tape contact pads. The second structure in certain embodiments may also be described as a wafer, comprising a glass carrier, and plurality of flexible ICs mounted thereon with UV-releasable adhesive for example. The actual wafer may be circular, but the array of devices on it will, in general, be rectangular. The first structure may also be described as a receiving foil in certain embodiments, incorporating, for example, fan-out contacts.

In certain embodiments, after transferring the ICs to the first structure, the resulting structure may then be processed so as to separate the first circuits or first circuit portions.

It will be appreciated that in certain embodiments of the invention the second roller may, or may not, have raised features in the same array as the first roller, or in a different array, and those raised features may be of the same or a different size and/or adhesion to facilitate picking off the ICs from the first roller and placing on the first structure.

Figure 10:
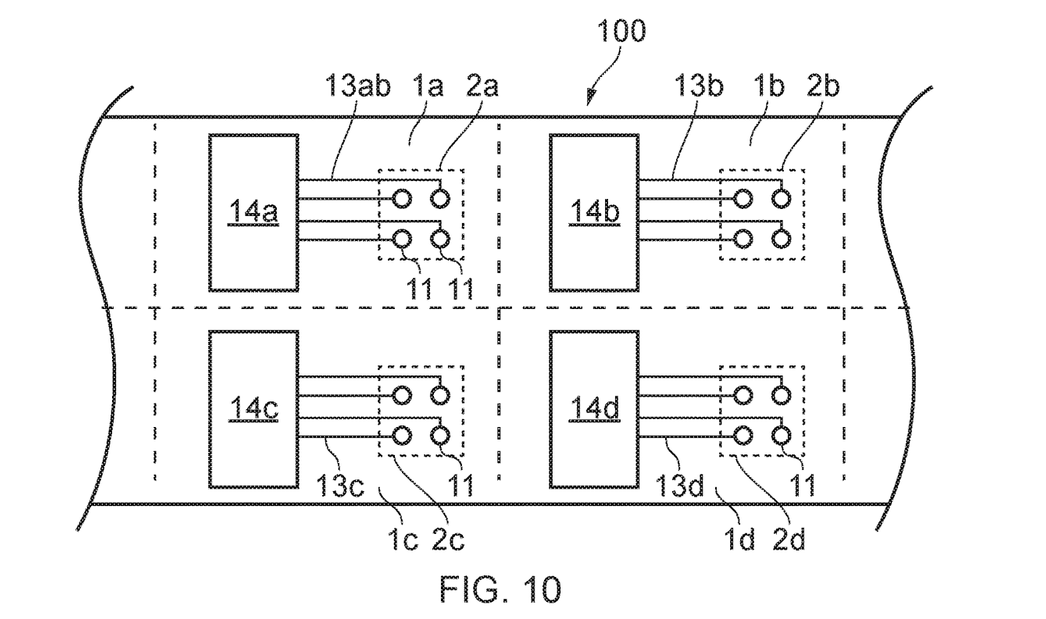
FIG. 10 is a schematic representation of a first structure used in certain embodiments of the invention.

Referring now to FIG. 10, this shows a first structure used in certain embodiments of the invention. In this example, the first structure is flexible and may be carried on a roller and transferred from one roller to another. FIG. 10 shows just one side of the structure 100, on which a plurality of ICs 2 are to be placed. The illustrated portion of the structure 100 shows a rectangular array of 4 first portions 1a, 1b, 1c, 1d, with the broken lines across and along the structure 100 illustrating the nominal positions of the first portions and hence how this structure 100 will eventually be cut up or otherwise divided to separate the final electronic circuits from each other. Each first portion comprises a respective group of contact pads 11 and a corresponding plurality of electrical tracks, wires, traces, or other such electrically conductive entities 13 connecting the array of contact pads 11 to a further sub-portion 14 of the electronic circuit portion 1. Thus, the portions 14a-14d may, for example, comprise one or more further circuit components. The nominal positions at which the respective ICs are to be mounted on the groups of contact pads 11 are labelled 2a-2d in the figure. Thus, in certain embodiments after each IC has been mounted in its respective position on the first circuit portion 1, the resultant structure comprises a functioning electronic circuit. In other embodiments, further processing, for example incorporating connection of the first portion and IC to other electrical entities, may be required to complete the relevant circuits.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A method of manufacturing a plurality of electronic circuits, each electronic circuit comprising a respective first portion, comprising a respective group of contact pads, and a respective integrated circuit, IC, comprising a respective group of terminals and mounted on the respective group of contact pads with each terminal in electrical contact with a respective contact pad, the method comprising:
providing a first structure comprising the plurality of first portions;
providing a second structure comprising the plurality of ICs and a common support arranged to support the plurality of ICs;
transferring said ICs from the common support onto a first roller,
transferring said ICs from the first roller onto a second roller; and transferring said ICs from the second roller onto the first structure such that each group of terminals is mounted on a respective group of contact pads, wherein transferring said ICs from the common support onto the first roller comprises picking said ICs from the common support with the first roller, wherein said picking comprises engaging each IC with a respective one of a plurality of IC-engaging features provided on the first roller, wherein each IC-engaging feature comprises a respective IC-engaging surface, each IC-engaging surface being arranged a common radial distance from a rotational axis of the first roller, and wherein each IC-engaging surface is resilient.

2. A method of manufacturing a plurality of electronic circuits, each electronic circuit comprising a respective first portion, comprising a respective group of contact pads, and a respective integrated circuit, IC, comprising a respective group of terminals and mounted on the respective group of contact pads with each terminal in electrical contact with a respective contact pad, the method comprising:

providing a first structure comprising the plurality of first portions;

providing a second structure comprising the plurality of ICs and a common support arranged to support the plurality of ICs;

transferring said ICs from the common support onto a first roller;

transferring said ICs from the first roller onto a second roller; and transferring said ICs from the second roller onto the first structure such that each group of terminals is mounted on a respective group of contact pads, wherein transferring said ICs from the common support onto the first roller comprises picking said IC's from the common support with the first roller, wherein said picking comprises engaging each IC with a respective one of a plurality of IC-engaging features provided on the first roller, and wherein each IC-engaging feature is resilient.

3. A method of manufacturing a plurality of electronic circuits, each electronic circuit comprising a respective first portion, comprising a respective group of contact pads, and a respective integrated circuit, IC, comprising a respective group of terminals and mounted on the respective group of contact pads with each terminal in electrical contact with a respective contact pad, the method comprising:

providing a first structure comprising the plurality of first portions;

providing a second structure comprising the plurality of ICs and a common support arranged to support the plurality of ICs, transferring said ICs from the common support onto a first roller;

transferring said ICs from the first roller onto a second roller; and transferring said ICs from the second roller onto the first structure such that each group of terminals is mounted on a respective group of contact pads, wherein transferring said ICs from the common support onto the first roller comprises picking said ICs from the common support with the first roller, wherein said picking comprises engaging each IC with a respective one of a plurality of IC-engaging features provided on the first roller, and wherein the plurality of ICs are arranged as a regular array on the common support, with a repetition interval of a distance D1 in a first direction, and the plurality of IC-engaging features are arranged as a regular array on the first roller with a repetition interval of n×D1 in a corresponding first direction, where n is an integer greater than or equal to 2, and the method comprises arranging the second structure at a first position relative to the first roller, picking a first group of the plurality of ICs from the common support by selectively engaging each IC of that first group with said IC-engaging features, transferring said first group of ICs from the first roller onto the second roller and then from the second roller onto the first structure.

4. The method in accordance with claim 3, wherein said corresponding first direction is one of: a direction parallel to a rotational axis of the first roller; and a circumferential distance around the first roller.

5. The method in accordance with claim 3, wherein the first portions are arranged as a regular array in the first structure and n×D1 corresponds to a repetition interval of the groups of contact pads in a corresponding first direction on the first structure.

6. The method in accordance with claim 3, further comprising, after transferring said first group of ICs from the first roller onto the second roller and then from the second roller onto the first structure, arranging the remaining portion of the second structure at a second position relative to the first roller, picking a second group of the plurality of ICs from the common support by selectively engaging each IC of that second group with said IC-engaging features, transferring said second group of ICs from the first roller to the second roller and then from the second roller onto the first structure.

7. The method in accordance with claim 3, wherein the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

8. The method in accordance with claim 7, wherein said corresponding second direction is one of: a circumferential distance around the first roller; and a direction parallel to the rotation axis of the first roller.

9. The method in accordance with claim 7, wherein the first portions are arranged as a regular array in the first structure and m×D2 corresponds to a repetition interval of the groups of contact pads in a corresponding second direction on the first structure.

10. An apparatus for manufacturing a plurality of electronic circuits, each electronic circuit comprising a respective first portion, comprising a respective group of contact pads, and a respective integrated circuit, IC, comprising a respective group of terminals and mounted on the respective group of contact pads with each terminal in electrical contact with a respective contact pad, the apparatus comprising:

a first roller arranged to rotate about a first rotational axis;

a second roller arranged to rotate about a second rotational axis, said second rotational axis being parallel to the first rotational axis;

roller drive means controllable to drive the rollers to rotate about their respective rotational axes;

a first support means arranged to support a first structure comprising the plurality of first portions and controllable to translate said first structure relative to said second rotational axis;

a second support means arranged to support a second structure, comprising the plurality of ICs and a common support arranged to support the plurality of ICs, and controllable to translate said second structure relative to said first rotational axis; and control means arranged to control the roller drive means and first and second support the first roller onto the second roller, and transfer said ICs from the second roller onto the first structure such that each group of terminals is mounted on a respective group of contact pads, wherein the control means is arranged to rotate the first roller to pick said ICs from the common support onto the first roller, wherein the first roller comprises a plurality of IC-engaging features each arranged to engage and pick a respective IC from the common support onto the first roller, wherein each IC-engaging feature comprises a respective IC-engaging surface, each IC-engaging surface being arranged a common radial distance from the rotational axis of the first roller, and wherein each IC-engaging surface is resilient.

11. An apparatus for manufacturing a plurality of electronic circuits, each electronic circuit comprising a respective first portion, comprising a respective group of contact pads, and a respective integrated circuit, IC, comprising a respective group of terminals and mounted on the respective group of contact pads with each terminal in electrical contact with a respective contact pad, the apparatus comprising:

a first roller arranged to rotate about a first rotational axis, a second roller arranged to rotate about a second rotational axis, said second rotational axis being parallel to the first rotational axis;

roller drive means controllable to drive the rollers to rotate about their respective rotational axes;

a first support means arranged to support a first structure comprising the plurality of first portions and controllable to translate said first structure relative to said second rotational axis;

a second support means arranged to support a second structure, comprising the plurality of ICs and a common support arranged to support the plurality of ICs, and controllable to translate said second structure relative to said first rotational axis; and control means arranged to control the roller drive means and first and second support the first roller onto the second roller, and transfer said ICs from the second roller onto the first structure such that each group of terminals is mounted on a respective group of contact pads, wherein the control means is arranged to rotate the first roller to pick said ICs from the common support onto the first roller, wherein the first roller comprises a plurality of IC-engaging features each arranged to engage and pick a respective IC from the common support onto the first roller, and wherein each IC-engaging feature is resilient.

12. An apparatus for manufacturing a plurality of electronic circuits, each electronic circuit comprising a respective first portion, comprising a respective group of contact pads, and a respective integrated circuit, IC, comprising a respective group of terminals and mounted on the respective group of contact pads with each terminal in electrical contact with a respective contact pad, the apparatus comprising:

a first roller arranged to rotate about a first rotational axis;

a second roller arranged to rotate about a second rotational axis, said second rotational axis being parallel to the first rotational axis;

roller drive means controllable to drive the rollers to rotate about their respective rotational axes;

a first support means arranged to support a first structure comprising the plurality of first portions and controllable to translate said first structure relative to said second rotational axis;

a second support means arranged to support a second structure, comprising the plurality of ICs and a common support arranged to support the plurality of ICs, and controllable to translate said second structure relative to said first rotational axis; and control means arranged to control the roller drive means and first and second support means to transfer said ICs from the common support onto the first roller, transfer said ICs from the first roller onto the second roller, and transfer said ICs from the second roller onto the first structure such that each group of terminals is mounted on a respective group of contact pads, wherein the control means is arranged to rotate the first roller to pick said ICs from the common support onto the first roller, wherein the first roller comprises a plurality of IC-engaging features each arranged to engage and pick a respective IC from the common support onto the first roller, and wherein the second support means is adapted to support a second structure in which the plurality of ICs are arranged as a regular array on the common support, with a repetition interval of a distance D1 in a first direction, and the plurality of IC-engaging features are arranged as a regular array on the first roller with a repetition interval of n×D1 in a corresponding first direction, where n is an integer greater than or equal to 2, and the control means is adapted to control the roller drive means, second support means, and first support means to position the second structure at a first position relative to the first roller, pick a first group of the plurality of ICs from the common support by selectively engaging each IC of that first group with said IC-engaging features, transfer said first group of ICs from the first roller onto the second roller, and transfer said first group from the second roller onto the first structure.

13. The apparatus in accordance with claim 12, wherein said corresponding first direction is one of: a direction parallel to a rotational axis of the first roller; and a circumferential distance around the first roller.

14. The apparatus in accordance with claim 12, wherein the first portions are arranged as a regular array in the first structure and n×D1 corresponds to a repetition interval of the groups of contact pads in a corresponding first direction on the first structure.

15. The apparatus in accordance with claim 12, wherein the control means is adapted to control the roller drive means, second support means, and first support means, after transferring said first group of ICs from the first roller onto the second roller and from the second roller onto the first structure, to arrange the remaining portion of the second structure at a second position relative to the first roller, pick a second group of the plurality of ICs from the common support by selectively engaging each IC of that second group with said IC-engaging features, transfer said second group of ICs from the first roller to the second roller and transfer said second group of ICs from the second roller onto the first structure.

16. The apparatus in accordance with claim 12, wherein the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

17. The apparatus in accordance with claim 16, wherein said corresponding second direction is one of: a circumferential distance around the first roller; and a direction parallel to the rotation axis of the first roller.

18. The apparatus in accordance with claim 16, wherein the first portions are arranged as a regular array in the first structure and m×D2 corresponds to a repetition interval of the groups of contact pads in a corresponding second direction on the first structure.

* * * * *